(12) United States Patent
Lu et al.

(10) Patent No.: US 11,456,742 B2
(45) Date of Patent: Sep. 27, 2022

(54) SIGNAL ISOLATION SYSTEM AND SIGNAL ISOLATION CIRCUIT

(71) Applicant: Wistron Corporation, New Taipei (TW)

(72) Inventors: Wei-Chuan Lu, New Taipei (TW); Chih-Ping Huang, New Taipei (TW); Yu-Ting Liu, New Taipei (TW)

(73) Assignee: Wistron Corporation, New Taipei (TW)

(*) Notice: Subject to any disclaimer, the term of this patent is extended or adjusted under 35 U.S.C. 154(b) by 373 days.

(21) Appl. No.: 16/807,136

(22) Filed: Mar. 2, 2020

(65) Prior Publication Data

US 2021/0184678 A1      Jun. 17, 2021

(30) Foreign Application Priority Data

Dec. 11, 2019   (TW) .................... 108145337

(51) Int. Cl.

| | |
|---|---|
| *H03K 19/0175* | (2006.01) |
| *H03K 19/0944* | (2006.01) |
| *H04B 10/80* | (2013.01) |
| *G06F 13/42* | (2006.01) |
| *H03K 17/687* | (2006.01) |
| *H03K 19/0185* | (2006.01) |

(52) U.S. Cl.
CPC . *H03K 19/017572* (2013.01); *G06F 13/4282* (2013.01); *H03K 17/687* (2013.01); *H03K 19/017536* (2013.01); *H03K 19/018557* (2013.01); *H03K 19/0944* (2013.01); *H04B 10/802* (2013.01)

(58) Field of Classification Search
CPC ......... H03K 19/017572; H03K 17/687; H03K 19/017536; H03K 19/018557; H03K 19/0944; G06F 13/4282; H04B 10/802
See application file for complete search history.

(56) References Cited

U.S. PATENT DOCUMENTS

| | | | |
|---|---|---|---|
| 8,378,663 B2* | 2/2013 | Cadoux ............... | G01R 15/146 324/117 R |
| 9,225,169 B1* | 12/2015 | Fang ................... | H04B 10/802 |
| 2003/0215020 A1* | 11/2003 | Dong ................. | H04L 25/0268 375/222 |
| 2017/0237417 A1* | 8/2017 | Lu ...................... | H01L 27/0288 327/328 |

FOREIGN PATENT DOCUMENTS

| | | | |
|---|---|---|---|
| JP | 2017151740 A | | 8/2017 |
| TW | I496134 B | * | 7/2013 |
| TW | I496134 B | | 8/2015 |

* cited by examiner

*Primary Examiner* — Freshteh N Aghdam
(74) *Attorney, Agent, or Firm* — Winston Hsu

(57) ABSTRACT

A signal isolation system includes an external device; and a signal isolation circuit, coupled to the external device, including a control circuit, configured to operate the signal isolation circuit in an input mode or an output mode according to a status of the external device; a digital input/output circuit, configured to input/output signal based on the input mode or the output mode determined by the control circuit; and an input/output port, coupled to the digital input/output circuit, configured to be an input port or an output port according to the input mode or the output mode determined by the control circuit.

10 Claims, 3 Drawing Sheets

SIGNAL ISOLATION SYSTEM AND SIGNAL ISOLATION CIRCUIT

BACKGROUND OF THE INVENTION

1. Field of the Invention

The present invention relates to a signal isolation system and signal isolation circuit, and more particularly, to a signal isolation system and signal isolation circuit capable of utilizing a single port as an input port and an output port.

2. Description of the Prior Art

Digital input/output interface is widely utilized for signal transmission in industrial environment, which exists common mode voltages, transient voltages and electronic noises. Conventional technique of signal isolation utilizes optical coupler elements to isolate high voltages and the transient voltages to stabilize signal transmission quality in the applied environment, avoid affecting other parts in circuit by the transient voltages and protect equipment and those who operate the equipment. In conventional industrial control field, since demands for the digital input/output are increased, e.g. functions of isolation, wide-range voltage application, dry contact and wet contact, more input/output pins are needed to implement the above functions to the related industrial equipment. However, after the conventional industrial equipment is added with the isolation function, cooperation with hardware circuit is necessary to achieve the function of digital input/output, that is, the conventional hardware circuit is restricted to the input/output port, which can only be respectively utilized for input or output. Therefore, improvements are necessary to the conventional technique.

SUMMARY OF THE INVENTION

The present invention provides a signal isolation system and signal isolation circuit to utilize a single port as an input port or an output port for a digital input/output interface, such that related industrial equipment are not restricted to the input/output interface of conventional hardware.

An embodiment of the present invention discloses a signal isolation system, comprises an external device; and a signal isolation circuit, coupled to the external device, comprising: a control circuit, configured to operate the signal isolation circuit in an input mode or an output mode according to a status of the external device; a digital input/output circuit, configured to input/output signal based on the input mode or the output mode determined by the control circuit; and an input/output port, coupled to the digital input/output circuit, configured to be an input port or an output port according to the input mode or the output mode determined by the control circuit.

Another embodiment of the present invention discloses a signal isolation circuit, comprises a control circuit, configured to operate the signal isolation circuit in an input mode or an output mode according to a status of the external device; a digital input/output circuit, configured to input/output signal based on the input mode or the output mode determined by the control circuit; and an input/output port, coupled to the digital input/output circuit, configured to be an input port or an output port according to the input mode or the output mode determined by the control circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
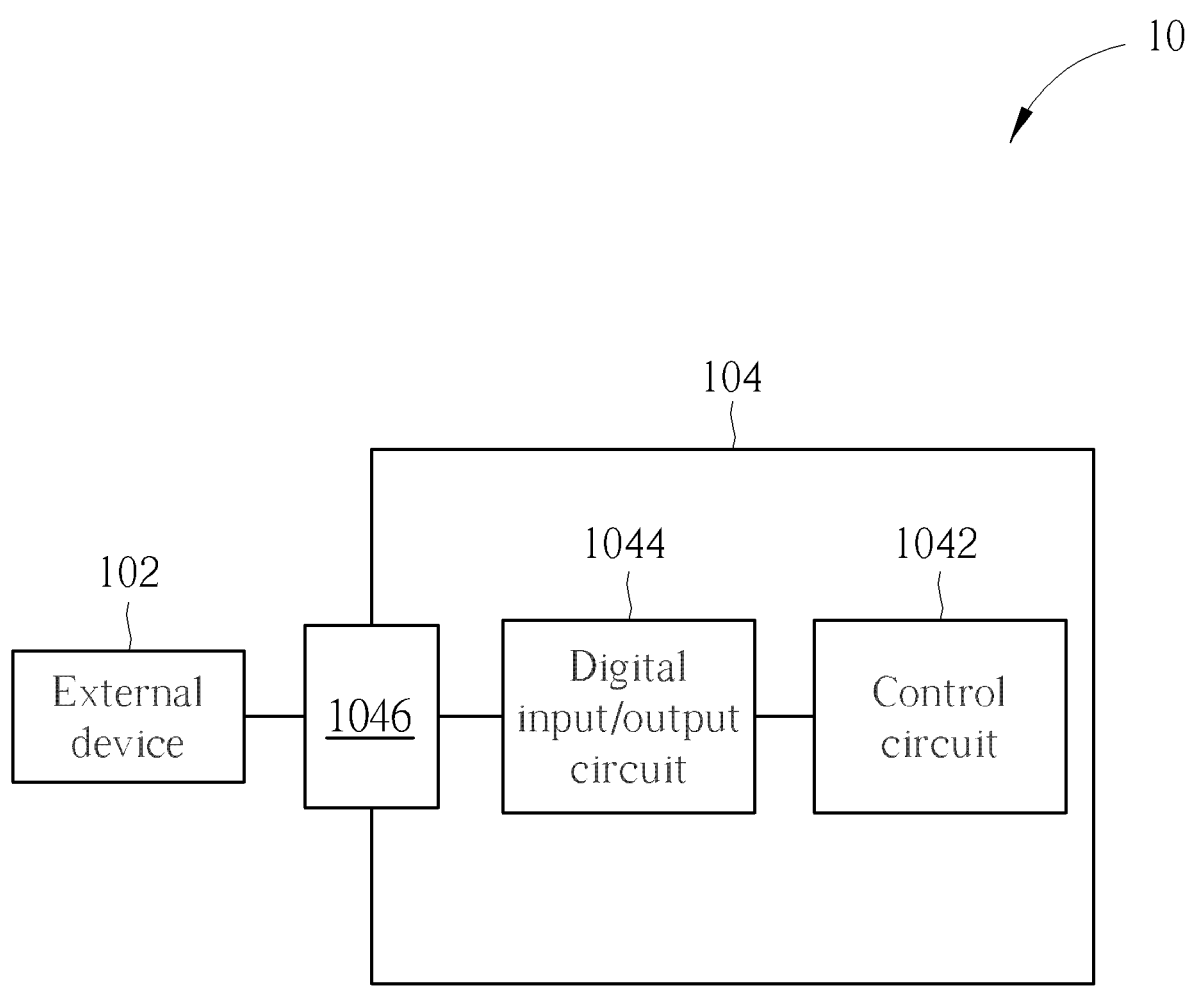
FIG. 1 is a schematic diagram of a signal isolation system according to an embodiment of the present invention.

Please refer to FIG. 1, which is a schematic diagram of a signal isolation system 10 according to an embodiment of the present invention. The signal isolation system 10 includes an external device 102 and a signal isolation circuit 104, wherein the external device 102 may be a power supply device. The signal isolation circuit 104 is coupled to the external device 102, and includes a control circuit the control circuit 1042, a digital input/output circuit 1044 and an input/output port 1046. The control circuit 1042 is configured to operate the signal isolation circuit 104 in an input mode or an output mode according to a status of the external device 102. The digital input/output circuit 1044 is configured to input/output signal based on the input mode or the output mode determined by the control circuit 1042. The input/output port 1046 is coupled to the digital input/output circuit 1044, configured to be an input port or an output port according to the input mode or the output mode determined by the control circuit 1042. For example, when the signal isolation circuit 104 is applied on an industrial equipment, the signal isolation circuit 104 may operate the control circuit 1042 in the input mode based on the status of the external device 102, so as to isolate a wide-range voltage signal from the external device 102 via the digital input/output circuit 1044 and take the input/output port 1046 as an input port to transmit an input signal from the external device 102 to the control circuit 1042. Therefore, the signal isolation system 10 according to an embodiment of the present invention may achieve the goal of inputting/outputting signal with single port and control the wide-range voltage signal when applied on the wide-range voltage applications.

Figure 2:
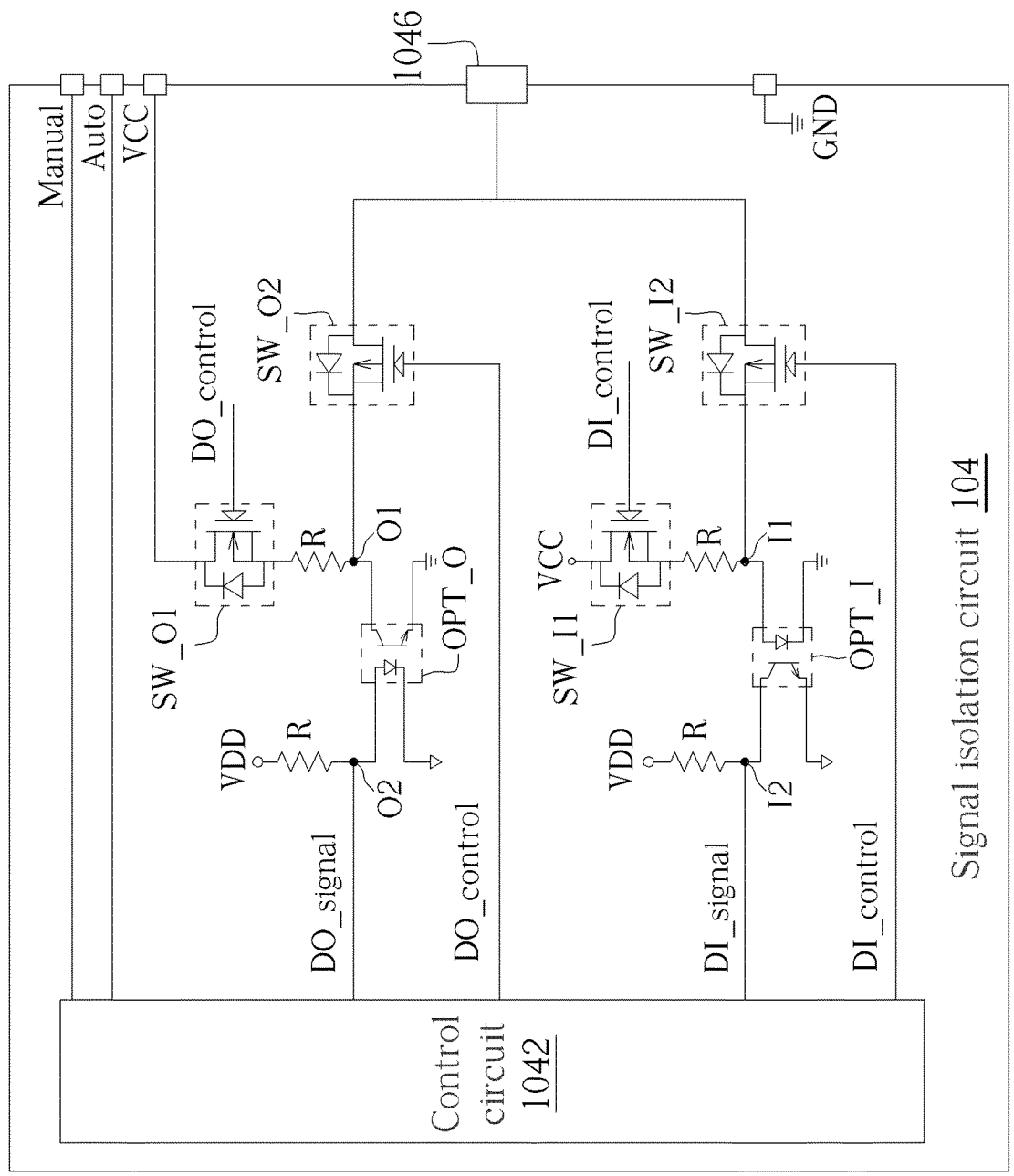
FIG. 2 is a schematic diagram of a signal isolation circuit according to an embodiment of the present invention.

In detail, please refer to FIG. 2, which is a schematic diagram of a signal isolation circuit 104 according to an embodiment of the present invention. As shown in FIG. 2, the digital input/output circuit 1044 of the signal isolation circuit 104 includes an input optical coupler OPT_I, an output optical coupler OPT_O, a plurality of input switches SW_I1, SW_I2, a plurality of output switches SW_O1, SW_O2 and a plurality of current-limiting resistors R. The input optical coupler OPT_I includes a first terminal I1 and a second terminal I2, wherein the first terminal I1 is coupled to the input switch SW_I1 and the input switch SW_I2, and coupled to a primary power source VCC via the input switch SW_I1, and the second terminal I2 is coupled to the control circuit 1042 and a secondary power source VDD, such that the control circuit 1042 conducts the input switches SW_I1, SW_I2 by a digital input control signal DI_control to transmit a digital input signal DI_signal into the control circuit 1042 when the control circuit 1042 operates the signal isolation circuit 104 in the input mode.

On the other hand, the output optical coupler OPT_O is coupled to the control circuit 1042 and the output switches SW_O1, SW_O2, and the output optical coupler OPT_O includes a first terminal O1 and a second terminal O2, wherein the first terminal O1 is coupled to the output switch SW_O1 and the output switch SW_O2, and the first terminal O1 is coupled to a primary power source VCC via the output switch SW_O1. The second terminal O2 is coupled to the control circuit 1042 and a secondary power source VDD, such that the control circuit 1042 conducts the output switches SW_O1, SW_O2 by a digital output control signal DO control to transmit a digital output signal DO_signal to the external device 102 when the control circuit 1042 operates the signal isolation circuit 104 in the output mode.

Notably, the above mentioned input optical coupler OPT_I and output optical coupler OPT_O are utilized for implementing signal isolation technique, and the current-limiting resistors R are utilized for preventing burning down the input optical coupler OPT_I and the output optical coupler OPT_O due to overcurrent, and the input switches SW_I1, SW_I2 and the output switches SW_O1, SW_O2 may be Metal-Oxide-Semiconductor Field-Effect Transistors (MOSFET), so as to input a digital input signal DI_signal to the control circuit 1042 or output a digital output signal DO_signal to the external device 102, when the input switches SW_I1, SW_I2 or the output switches SW_O1, SW_O2 are respectively conducted.

In addition, the signal isolation circuit 104 further includes a manual mode pin Manual and an automatic mode pin Auto. The manual mode pin Manual is coupled to the external device 102 and is configured to receive a status signal related to the external device 102 and transmit to the control circuit 1042 for determining to operate the signal isolation circuit 104 in the input mode or the output mode. The automatic mode pin Auto is coupled to the external device 102 and is configured to confirm the status signal from the external device 102 via a serial communication BUS, such that the control circuit 1042 may determine to operate the signal isolation circuit 104 in the input mode or the output mode. In other words, the control circuit 1042 of the signal isolation circuit 104 may determine to operate the signal isolation circuit 104 in the input mode or the output mode according to the signal received by the automatic mode pin Auto. Therefore, the signal isolation circuit 104 according to an embodiment of the present invention may define different signals as a general-purpose input (GPI) signal or a general-purpose output (GPO) signal in advance. When the manual mode pin Manual receives the signal, the control circuit 1042 accordingly determines to operate the signal isolation circuit 104 in the input mode or the output mode. Or, in another embodiment, the signal isolation circuit 104 may confirm the signal from the external device 102 as the GPI signal or the GPO signal via the serial communication BUS of the automatic mode pin Auto and determine to operate the signal isolation circuit 104 in the input mode or the output mode. Therefore, the signal isolation circuit 104 may protect the equipment by inputting/outputting signal with a single port and support applications of dry contact and wet contact.

Figure 3:
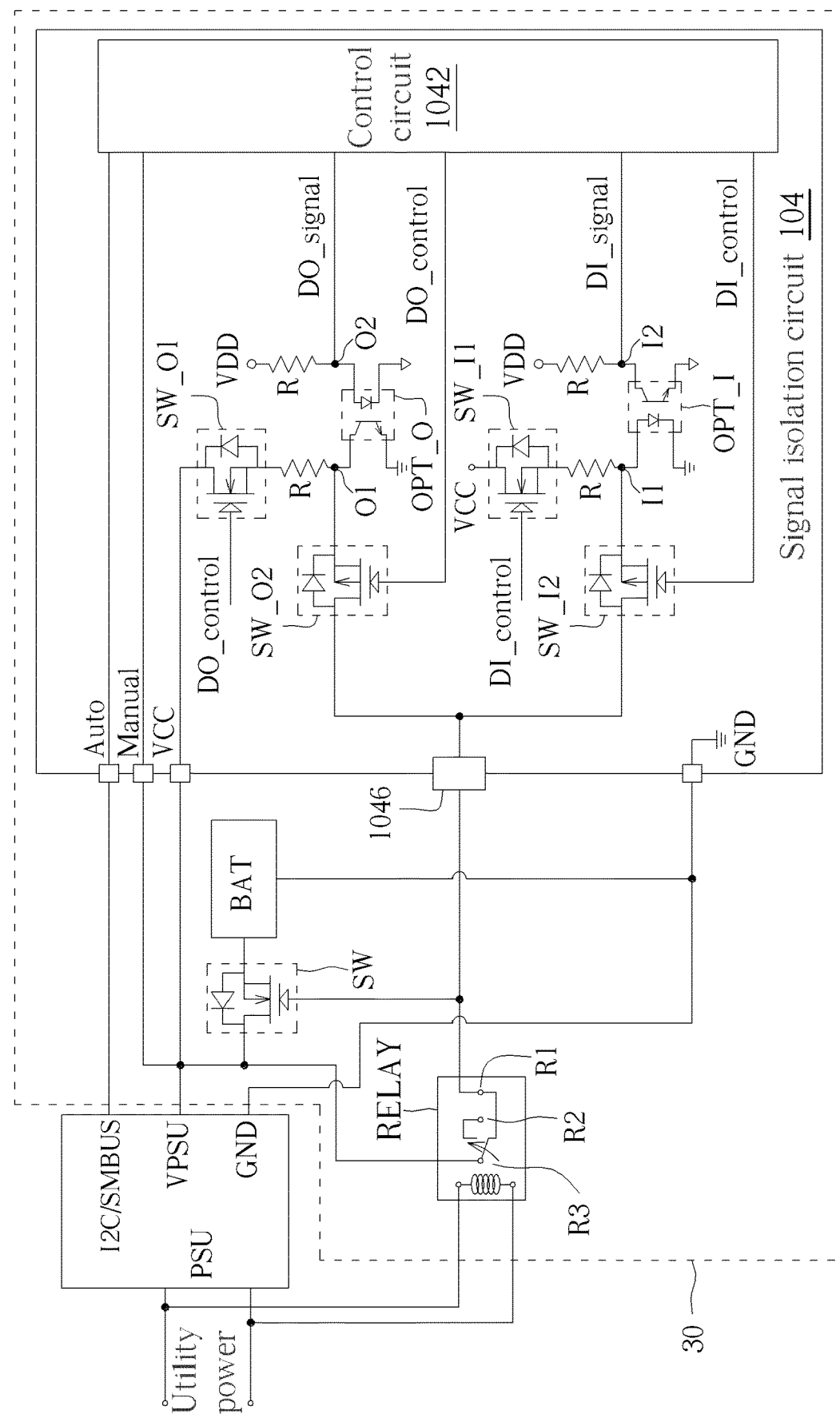
FIG. 3 is a schematic diagram when the signal isolation circuit is applied on an uninterruptible power system according to an embodiment of the present invention.

Based on different applications and design concepts, the signal isolation circuit 104 of the present invention may be utilized on different equipment. Please refer to FIG. 3, which is a schematic diagram when the signal isolation circuit 104 is applied on an uninterruptible power system (UPS) 30 according to an embodiment of the present invention. The UPS 30 is a system includes the signal isolation circuit 104, and thereby inherits the reference signs of the signal isolation circuit 104. In addition, the UPS 30 further includes a relay RELAY, a switch SW and a battery BAT, and the UPS 30 is coupled to a power supply device PSU (i.e. corresponds to the external device 102 in FIG. 1), wherein the relay RELAY includes a plurality of junctions R1, R2, R3. The power supply device PSU is coupled to utility voltage (e.g. 110V-240V alternating voltage) to transform the utility voltage into energy and output the energy to the UPS 30 via VPSU.

Since a pin of Inter-Integrated Circuit Bus (I2C) or System Management Bus (SMBus) of the power supply device PSU is coupled to the automatic mode pin Auto of the signal isolation circuit 104, the control circuit 1042 may confirm the status signal from the power supply device PSU via the serial communication BUS, so as to determine to operate the signal isolation circuit 104 in the input mode or the output mode. Therefore, when the power supply device PSU receives the utility voltage, the status signal of the power supply device PSU may be transmitted to the control circuit 1042 by a serial communication signal. Then, after the control circuit 1042 receives the status signal, the input switches SW_I1, SW_I2 are conducted, such that signal generated by the relay RELAY is transmitted to the control circuit 1042 via the input switch SW_I2 and the input optical coupler OPT_I, and the control circuit 1042 is informed that the utility voltage is working normally. Notably, when the power supply device PSU receives the utility voltage, the junctions R2, R3 of the relay RELAY are conducted, and the energy of the UPS 30 is provided by the power supply device PSU rather than the battery BAT.

When the utility voltage is working abnormally, the power supply device PSU cannot provide the voltage and transmit signal of current status to the control circuit 1042. In an example, the battery BAT may provide a signal 24VDC, which is generated by a leakage current of a body diode of the switch SW, to the control circuit 1042. When the control circuit 1042 is informed that the utility voltage is abnormal by receiving the signal 24VDC by the manual mode pin Manual, an input status of the signal isolation circuit 104 is changed to an output status accordingly, and the output switches SW_O1, SW_O2 are conducted, such that a digital output signal is transmitted to the switch SW via the output optical coupler OPT_O and the output switch SW_O2 to conduct the switch SW. As such, the battery BAT may provide the energy to the control circuit 1042 for operation. Notably, when the power supply device PSU does not receive the utility voltage (i.e. the power supply device PSU cannot provide the voltage normally), the junctions R1, R3 of the relay RELAY are conducted, such that the energy of the UPS 30 is provided by the battery BAT.

The embodiments of the present invention illustrated above may explain that the signal isolation circuit of the present invention may be utilized as the digital input/output interface for the input port/output port with the single port, such that the related industrial equipment may not be restricted to limits of pin of the conventional hardware and may be capable of providing signal control for the wide-range voltage applications. In addition, users may define input/output ports via a programmable application interface based on their requirements and not limited to the hardware circuit, so as to reduce overall circuit area and development cost. Moreover, those skilled in the art may properly design the signal isolation circuit according to different requirements, e.g. the switches of the digital input/output circuit may be implemented by other circuit elements, which are applicable to the present invention and not limited thereto.

In summary, the present invention provides a signal isolation system and a signal isolation circuit to utilize a single port as an input port or an output port for a digital input/output interface, such that related industrial equipment may not be restricted to input/output limits of pin of conventional hardware and reduce overall circuit area and development cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal isolation system, comprising:
an external device; and
a signal isolation circuit, coupled to the external device, comprising:
   a control circuit, configured to operate the signal isolation circuit in an input mode or an output mode according to a status of the external device;
   a digital input/output circuit, configured to input/output signal based on the input mode or the output mode determined by the control circuit; and
   a single input/output port, coupled to the digital input/output circuit, configured to be an input port or an output port according to the input mode or the output mode determined by the control circuit.

2. The signal isolation system of claim 1, wherein the digital input/output circuit comprises:
   an input optical coupler, coupled to the control circuit and a plurality of input switches, such that the control circuit conducts the plurality of input switches to transmit a digital input signal generated by the external device to the control circuit, when the control circuit operates the signal isolation circuit in the input mode; and
   an output optical coupler, coupled to the control circuit and a plurality of output switches, such that the control circuit conducts the plurality of output switches to transmit a digital output signal to the external device, when the control circuit operates the signal isolation circuit in the output mode.

3. The signal isolation system of claim 2, wherein the plurality of input switches and the plurality of output switches are Metal-Oxide-Semiconductor Field-Effect Transistors (MOSFETs).

4. The signal isolation system of claim 1, wherein the signal isolation circuit further comprises:
   a manual mode pin, coupled to the external device, configured to receive a status signal of the external device and transmit the status signal to the control circuit, such that the control circuit determines to operate the signal isolation circuit in the input mode or the output mode; and
   an automatic mode pin, coupled to the external device, configured to confirm the status signal from the external device via a serial communication BUS, such that the control circuit determines to operate the signal isolation circuit in the input mode or the output mode.

5. A signal isolation circuit, comprising:
   a control circuit, configured to operate the signal isolation circuit in an input mode or an output mode according to a status of the external device;
   a digital input/output circuit, configured to input/output signal based on the input mode or the output mode determined by the control circuit; and
   a single input/output port, coupled to the digital input/output circuit, configured to be an input port or an output port according to the input mode or the output mode determined by the control circuit.

6. The signal isolation circuit of claim 5, wherein the digital input/output circuit comprises:
   an input optical coupler, having a first terminal and a second terminal, wherein the first terminal is coupled to a first input switch and a second input switch, and is coupled to a primary power source via the first input switch, the second terminal is coupled to the control circuit and a secondary power source, such that the control circuit conducts the first input switch and the second input switch to transmit a digital input signal generated by the external device to the control circuit, when the control circuit operates the signal isolation circuit in the input mode.

7. The signal isolation circuit of claim 6, wherein the first input switch and the second input switch are Metal-Oxide-Semiconductor Field-Effect Transistors (MOSFETs).

8. The signal isolation circuit of claim 5, wherein the digital input/output circuit comprises:
   an output optical coupler, having a first terminal and a second terminal and a second terminal, wherein the first terminal is coupled to a first output switch and a second output switch, and coupled to a primary power source via the first output switch, the second terminal is coupled to the control circuit and a secondary power source, such that the control circuit conducts the first output switch and the second output switch to transmit a digital output signal to the external device, when the control circuit operates the signal isolation circuit in the output mode.

9. The signal isolation circuit of claim 8, wherein the first output switch and the second output switch are Metal-Oxide-Semiconductor Field-Effect Transistors (MOSFETs).

10. The signal isolation circuit of claim 5, wherein the signal isolation circuit further comprises:
    a manual mode pin, coupled to the external device, configured to receive a status signal of the external device and transmit the status signal to the control circuit, such that the control circuit determines to operate the signal isolation circuit in the input mode or the output mode; and
    an automatic mode pin, coupled to the external device, configured to confirm the status signal from the external device via a serial communication BUS, such that the control circuit determines to operate the signal isolation circuit in the input mode or the output mode.

* * * * *